United States Patent
Yeh et al.

(10) Patent No.: US 8,367,563 B2
(45) Date of Patent: Feb. 5, 2013

(54) METHODS FOR A GATE REPLACEMENT PROCESS

(75) Inventors: Matt Yeh, Hsinchun (TW); Hui Ouyang, Chubei (TW); Da-Yuan Lee, Jhubei (TW); Kuang Yuan Hsu, Fongyuan (TW); Hun-Jan Tao, Hsinchu (TW); Xiong-Fei Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 579 days.

(21) Appl. No.: 12/575,280

(22) Filed: Oct. 7, 2009

(65) Prior Publication Data

US 2011/0081774 A1   Apr. 7, 2011

(51) Int. Cl.
*H01L 21/3205* (2006.01)
(52) U.S. Cl. .................................................. 438/791
(58) Field of Classification Search .................. 438/591
See application file for complete search history.

(56) References Cited

U.S. PATENT DOCUMENTS

| | | | |
|---|---|---|---|
| 6,248,675 B1 * | 6/2001 | Xiang et al. | 438/166 |
| 6,392,280 B1 | 5/2002 | Besser et al. | |
| 6,544,906 B2 | 4/2003 | Rotondaro et al. | |
| 7,034,361 B1 * | 4/2006 | Yu et al. | 257/349 |
| 2003/0129817 A1 | 7/2003 | Visokay et al. | |

OTHER PUBLICATIONS

G. D. Wilk and B.Brar, Electrical Characteristics of High-Quality Sub-25-A Oxides Grown by Ultraviolet Ozone Exposure at Low Temperature,1EEE Electron Device Letters, vol. 20, No. 3, Mar. 1999, three (3) pages, Manuscript May 22, 1998; revised Nov. 6, 1998, Publisher Item Identifier S 0741-3106(99)02470-2.

* cited by examiner

*Primary Examiner* — Bradley K Smith
(74) *Attorney, Agent, or Firm* — Haynes and Boone, LLP

(57) ABSTRACT

A method for fabricating a semiconductor device is disclosed. In one embodiment, the method may include providing a substrate; forming a gate structure including a first dummy gate over the substrate; removing the first dummy gate from the gate structure to form a trench; forming an interfacial layer, high-k dielectric layer, and capping layer to partially fill in the trench; forming a second dummy gate over the capping layer, wherein the second dummy gate fills the trench; and replacing the second dummy gate with a metal gate. In one embodiment, the method may include providing a substrate; forming an interfacial layer over the substrate; forming a high-k dielectric layer over the interfacial layer; forming an etch stop layer over the high-k dielectric layer; forming a capping layer including a low thermal budget silicon over the etch stop layer; forming a dummy gate layer over the capping layer; forming a gate structure; and performing a gate replacement process.

20 Claims, 13 Drawing Sheets

METHODS FOR A GATE REPLACEMENT PROCESS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, the continuing decrease in technology nodes has lead to a desire to replace a conventional polysilicon gate electrode with a metal gate electrode to improve device performance. One process for forming a metal gate structure (e.g., having a metal gate electrode) is referred to as a "gate last" process, where the final gate stack is fabricated last. This reduces the number of subsequent processes, including high temperature processing, that must be performed after formation of the gate structures. However, there are challenges to implementing such features and processes in conventional fabrication. As the gate length and spacing between devices decreases, these problems are exacerbated. For example, gate replacement processes suffer from gap fill issues and need ways to reduce an equivalent oxide thickness.

Accordingly, what is needed is a method for fabricating an IC device that addresses the above stated issues.

SUMMARY

A method for fabricating a semiconductor device is provided. In one embodiment, the method includes providing a substrate and forming a gate structure including a first dummy gate over the substrate. The first dummy gate is removed from the gate structure to form a trench, and an interfacial layer, high-k dielectric layer, and capping layer is formed to partially fill in the trench. A second dummy gate may be formed over the capping layer, wherein the second dummy gate fills the trench. The second dummy gate may be replaced with a metal gate.

It is understood that a gate structure is not limited to a single gate structure and can include a plurality of gate structures.

In one embodiment, the method for fabricating a semiconductor device includes providing a substrate; forming an interfacial layer over the substrate; forming a high-k dielectric layer over the interfacial layer; forming an etch stop layer over the high-k dielectric layer; forming a capping layer including a low thermal budget silicon over the etch stop layer; forming a dummy gate layer over the capping layer; forming a gate structure; and performing a gate replacement process. The gate replacement process may include replacing at least the dummy gate layer and capping layer including the low thermal budget silicon with a metal gate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
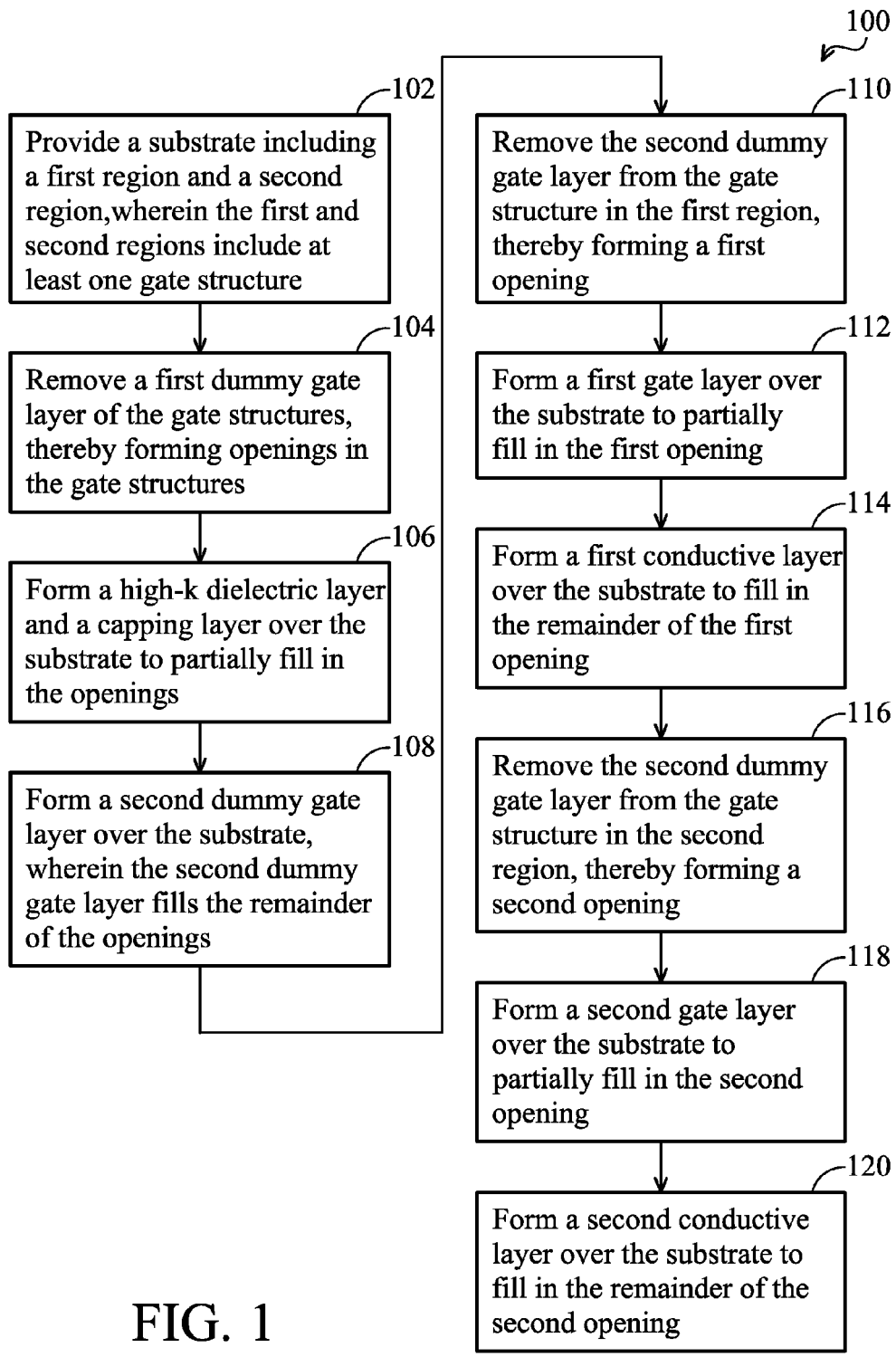
FIG. 1 is a flow chart of a method for fabricating an integrated circuit device according to aspects of the present disclosure.

The present disclosure relates generally to methods for manufacturing integrated circuit devices, and more particularly, to gate replacement processes (or methods).

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1, 2A-2N, 3, and 4A-4E, methods 100, 300 and semiconductor devices 200, 400 are collectively described below. The semiconductor devices 200, 400 illustrate an integrated circuit, or portion thereof, that can comprise memory cells and/or logic circuits. The semiconductor devices 200, 400 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOS s), high voltage transistors, and/or high frequency transistors; other suitable components; and/or combinations thereof. It is understood that additional steps can be provided before, during, and after the methods 100, 300, and some of the steps described below can be replaced or eliminated, for additional embodiments of the methods. It is further understood that additional features can be added in the semiconductor devices 200, 400, and some of the features described below can be replaced or eliminated, for additional embodiments of the semiconductor devices 200, 400.

In the present embodiments, the semiconductor devices 200, 400 are fabricated in a gate last process. Alternatively, the semiconductor devices 200, 400 may be fabricated in a gate first process or hybrid process including a gate first process and a gate last process. In the gate last process, a dummy poly gate structure is formed first and then the dummy poly gate structure may be removed and replaced with a metal gate structure. In the gate first process, a metal gate structure may be formed first and may be followed by a CMOS process flow to fabricate the final device. In the hybrid gate process, a metal gate structure of one type of device may be formed first and a metal gate structure of another type of device may be formed last. Further, in some embodiments, the gate last process, gate first process, or hybrid process may form a gate structure comprising polysilicon.

Double Dummy Gate Deposition Method

Figure 2A:
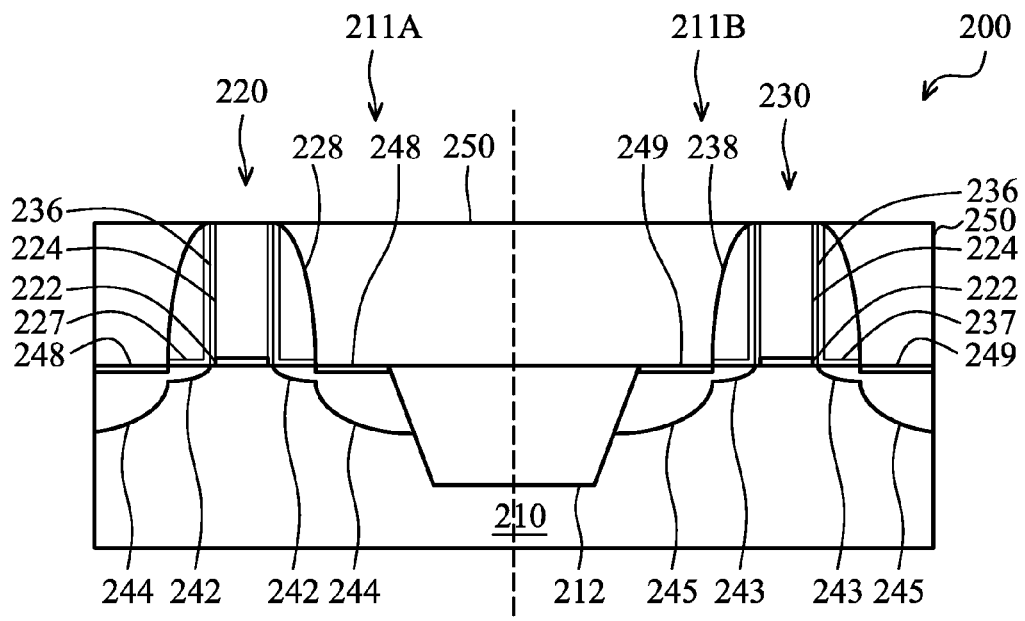
FIGS. 2A-2N are various cross-sectional views of embodiments of an integrated circuit device during various fabrication stages according to the method of FIG. 1.

FIG. 1 is a flow chart of one embodiment of the method 100 for fabricating the semiconductor device 200 in a "gate last" process. FIGS. 2A-2N are various cross-sectional views of the semiconductor device 200 according to one embodiment, in portion or entirety, during various fabrication stages of the method 100. Conventional gate replacement processes utilize a single dummy gate patterning approach. As technology nodes continue to decrease, particularly to 22 nm technology nodes and below, a gate length ($L_g$) continues to decrease and become smaller. It has been observed that the single dummy gate patterning approach may suffer from gap fill issues as gate lengths (or gate trenches) become smaller. The single dummy gate patterning approach also involves separate removal approaches for forming more than one device, such as a p-type device and an n-type device. This often requires two high-k dielectric layer deposition processes, which may present undesirable issues. Accordingly, the method 100 implements a double dummy gate deposition method. The double dummy gate deposition method can prevent (or eliminate) gap fill issues arising from small gate trenches (or lengths), and can provide a single high-k dielectric layer deposition process, which prevents issues arising from the current high-k dielectric layer double deposition process. It is understood that different embodiments may have different advantages, and that no particular advantage is necessarily required of any embodiment.

Referring to FIGS. 1 and 2A, the method 100 begins at block 102 where a substrate 210 including a first region 211A and a second region 211B is provided. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS) and regions configured for a P-type metal-oxide-semiconductor transistor device (referred to as a PMOS). In the present embodiment, the substrate 210 includes first region 211A configured for a PMOS device and second region 211B configured for a NMOS device. It is understood that the semiconductor device 200 may be formed by CMOS technology processing, and thus some processes are not described in detail herein.

One exemplary isolation region 212 is formed on the substrate 210 to isolate various regions (e.g., first and second regions 211A, 211B) of the substrate 210, and in the present embodiment, to isolate the NMOS and PMOS device regions. The isolation region 212 utilizes isolation technology, such as local oxidation of silicon (LOCOS) or shallow trench isolation (STI), to define and electrically isolate the various first and second regions 211A, 211B. In the present embodiment, the isolation region 212 includes a STI. The isolation region 212 comprises silicon oxide, silicon nitride, silicon oxynitride, other suitable materials, or combinations thereof. The isolation region 212 is be formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

One or more gate structures are formed over the substrate 210—at least one gate structure is formed over the substrate in the first region 211A and at least one gate structure is formed over the substrate in the second region 211B. In the present embodiment, a first gate structure 220 is formed within the first/PMOS region 211A, and a second gate structure 230 is formed within the second/NMOS region 211B. It is understood that a plurality of gate structures may be formed over the substrate 210 in the first and second regions 211A, 211B. The gate structures 220, 230 are formed by any suitable process. For example, the gate structures are formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching). The etching processes also include either purely chemical (wet etching), purely physical (ion milling), and/or combinations thereof. It is understood that the gate structures may be formed simultaneously, utilizing the same processing steps and processing materials; independently of one another, utilizing varying processing steps and processing materials; or using a combination of simultaneous and independent processing steps and processing materials.

In the present embodiment, the gate structures 220, 230 comprise gate stacks having the interfacial layer 222, 232 and first dummy gate layer 224, 234. The gate stack is formed by any suitable process, including the processes described herein. In one example, an interfacial layer and a first dummy gate layer are deposited over the substrate 210. Then, a layer of photoresist is formed over the first dummy gate layer by a suitable process, such as spin-on coating, and patterned to form a patterned photoresist feature. The pattern of the photoresist can then be transferred by a dry etching process to the underlying layers (i.e., the interfacial layer and first dummy gate layer) to form the gate stacks comprising interfacial layer 222, 232 and dummy gate layer 224, 234 as shown in FIG. 2A. The photoresist layer may be stripped thereafter. In another example, a hard mask layer is formed over the first dummy gate layer; a patterned photoresist layer is formed on the hard mask layer; the pattern of the photoresist layer is transferred to the hard mask layer and then transferred to the first dummy gate layer and the interfacial layer to form the gate stack of the gate structures 220, 230. It is understood that the above examples do not limit the processing steps that may be utilized to form the gate stack. It is further understood that the gate stack of the gate structures 220, 230 may comprise additional layers. For example, the gate structures 220, 230 may comprise interfacial layers, capping layers, diffusion/barrier layers, conductive layers, other suitable layers, and/or combinations thereof. Also, the semiconductor device 200 may include one or more antireflective coating layers (e.g., a top antireflective coating layer and/or a bottom antireflective coating layer).

The interfacial layer 222, 232 is formed over the substrate 210. The interfacial layer 222, 232 is formed by any suitable process to any suitable thickness. For example, the interfacial dielectric layer 222, 232 includes a silicon oxide layer (e.g., thermal oxide or chemical oxide) having a thickness ranging from about 10 angstroms (Å) to about 35 Å. Alternatively, the interfacial layer 222, 232 comprises silicon oxynitride (SiON). In an example, before the interfacial dielectric layer 222, 232 is grown over the substrate 210, a last pre-gate clean (e.g., utilizing an HF solution) and UV process may be performed.

The first dummy gate layer 224, 234 is formed over the interfacial layer 222, 232 by any suitable process to any suitable thickness. The first dummy gate layer 224, 234 may comprise multiple material layers. In the present example, the first dummy gate layer 224, 234 comprises polysilicon. The semiconductor device 200 may further include a hard mask layer (not shown) formed over the first dummy gate layer 224, 234. The hard mask layer may include silicon nitride, silicon oxynitride, silicon carbide, and/or other suitable dielectric materials, and may be formed using any suitable method, such as CVD, PVD, or sputtering.

A sealing layer 226, 236 may be formed on the sidewalls of the gate stacks of the gate structures 220, 230. In the present embodiment, the sealing layer 226, 236 is formed on the sidewalls of the interfacial layer 222, 232 and first dummy gate layer 224, 234. The sealing layer 226, 236 includes a dielectric material, such as silicon nitride, silicon oxynitride, silicon carbide, other suitable material, and/or combinations thereof. The sealing layer 226, 236 may include a single layer or multiple layer configuration. It should be noted that the sealing layer 226, 236 may protect the gate stacks of the gate structures 220, 230 from damage or loss during subsequent processing, and may also prevent oxidation during subsequent processing. The sealing layer 226, 236 is formed by any suitable process to any suitable thickness.

Spacers may further be formed on the sidewalls of the gate stacks. For example, spacer liner 227, 237 and gate spacers 228, 238 may be formed. The spacer liner 227, 237 and gate spacers 228, 238 are formed by any suitable process to any suitable thickness. The spacer liner 227, 228 may comprise an oxide material (e.g., silicon oxide), and the gate spacers 228, 238, which are positioned on each side of the gate structures 220, 230, may comprise a nitride material (e.g., silicon nitride). In various examples, the gate spacers 228, 238 comprise a dielectric material such as silicon nitride, silicon carbide, silicon oxynitride, other suitable materials, and/or combinations thereof. The gate spacers 228, 238 may be used to offset subsequently formed doped regions, such as heavily doped source/drain regions.

Various doped regions may also be formed in the substrate 210. For example, various doped regions comprise lightly doped source/drain (LDD) regions 242, 243 and source/drain (S/D) regions 244, 245 (also referred to as heavily doped S/D regions). The LDD regions 242, 243 and S/D regions 244, 245 are formed by one or more ion implantation processes, photolithography, diffusion, and/or other suitable processes. The doping species may depend on the type of device being fabricated, such as an NMOS or PMOS device. For example, the LDD regions 242, 243 and S/D regions 244, 245 are doped with p-type dopants, such as boron or $BF_2$; n-type dopants, such as phosphorus or arsenic; and/or combinations thereof. The LDD regions 242, 243 and S/D regions 244, 245 may comprise various doping profiles. It is understood that the LDD regions may be formed prior to formation of the gate spacers 228, 238, and the LDD regions may be aligned with an outer edge of the sealing layers 226, 236 following one or more implantation processes. Additionally, one or more annealing processes may be performed to activate the LDD regions 242, 243 and/or S/D regions 244, 245. The annealing processes comprise rapid thermal annealing (RTA) and/or laser annealing processes. It should be noted that during a subsequent annealing process (e.g., activation process) the dopants in the LDD regions 242, 243 may diffuse towards the sidewalls of the gate stack comprising the high-k dielectric layer 222, 232 and dummy gate layer 224, 234 such that a portion of each of the LDD regions 242, 243 may extend underneath a portion of the sealing layer 226, 236. The S/D regions 244, 245 may be aligned with an outer edge of the spacers 228, 238 following the one or more implantation processes.

The doped regions may be formed directly in the semiconductor substrate, in a P-well structure, in a N-well structure, in a dual-well structure, or using a raised structure. In some examples, the S/D regions 244, 245 include raised S/D regions, which may be formed by one or more epitaxy processes, such that SiGe features can be formed in a crystalline state in the substrate 210. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 210 (e.g., silicon). Thus, a strained channel may be achieved in the first or second regions 211A, 211B, depending on device configuration, to increase carrier mobility and enhance device performance.

One or more contact features 248, 249, such as silicide regions, may also be formed. The contact features 248, 249 are coupled to the S/D regions 244, 245. The contact features 248, 249 comprise silicide materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The contact features 248, 249 are formed by any suitable process, including the processes described herein. In the present embodiment, the contact features 248, 249 may be formed by a salicide (self-aligned silicide) process. For example, a metal material may be deposited over the substrate, including over the substrate (e.g., silicon regions) and/or doped regions. After deposition, the salicidation process may continue with a reaction between the deposited metal material and the silicon regions at an elevated temperature that is selected based on the specific metal material or materials. This is also referred to as annealing, which may be a RTP. The unreacted metal material is removed thereafter. The reacted silicide may require additional thermal process to reduce the resistance of the silicide.

A dielectric layer 250 is disposed over the substrate 210, such as an interlayer (or inter-level) dielectric (ILD) layer. The dielectric layer 250 comprises any suitable dielectric material including TEOS oxide, silicon oxide, silicon nitride, silicon oxynitride, hafnium oxide, zirconium oxide, titanium oxide, aluminum oxide, hafnium dioxide-alumina ($HfO_2$—$Al_2O_3$) alloy, PSG, BPSG, other suitable dielectric materials, and/or combinations thereof. Alternatively, the dielectric layer 250 comprises a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The dielectric layer 250 is formed by any suitable process to any suitable thickness, including by CVD, high density plasma CVD, spin-on, sputtering, and/or other suitable methods. The dielectric layer 250 may further include a multilayer structure comprising multiple dielectric materials. It is understood that additional layers may be formed overlying and/or underlying the dielectric layer 250.

Figure 2B:
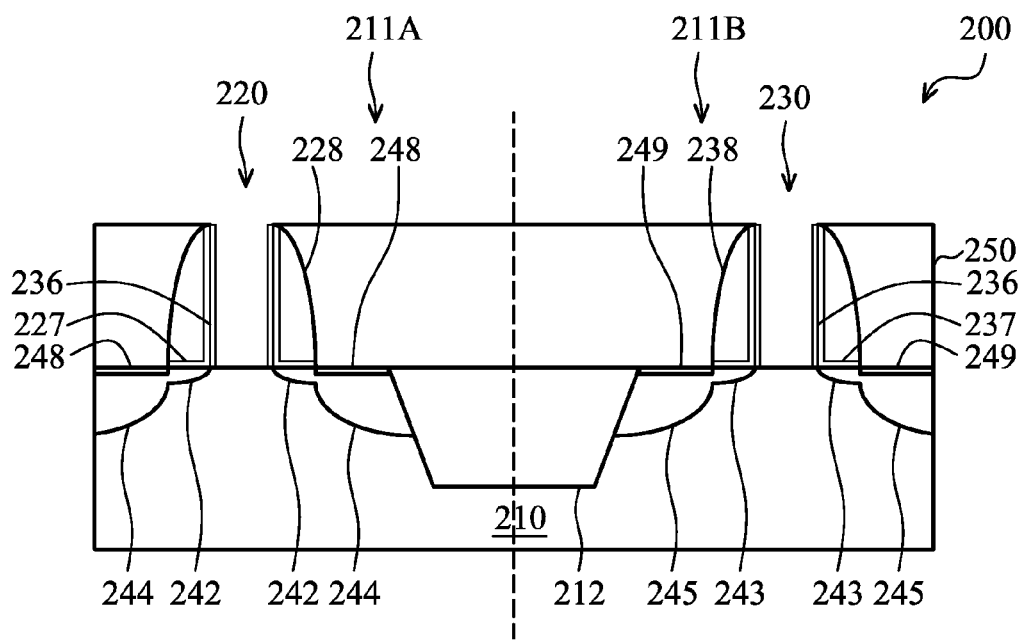

Referring to FIGS. 1 and 2B, at block 104, the first dummy gate layer is removed from the gate structures in the first and second regions, thereby forming openings in the gate structures. For example, the first dummy gate layer 224, 234 is removed from gate structures 220, 230 by any suitable process. As also illustrated, the interfacial layer 222, 232 may also be removed, simultaneously with or independent of the first dummy gate layer 224, 234. Removing dummy gate layer 224, 234 (and interfacial layer 222, 232) may include one or more etching processes, including wet etching processes, dry etching processes, or combinations thereof. The removed interfacial layer 222, 232 and first dummy gate layer 224, 234 form an opening (or trench) in the gate structures 220, 230.

Figure 2C:
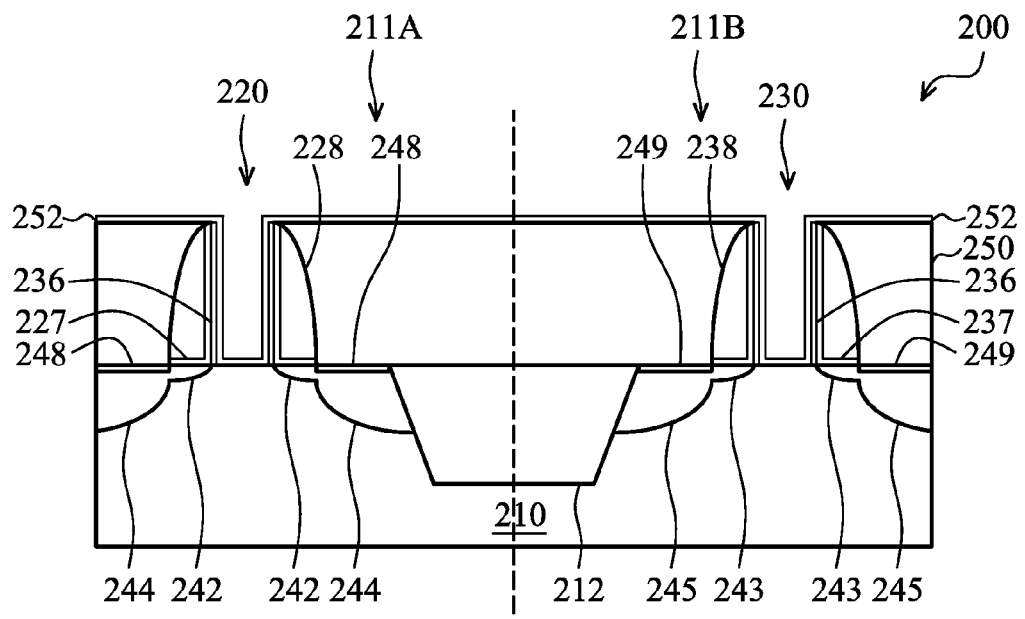
Figure 2D:
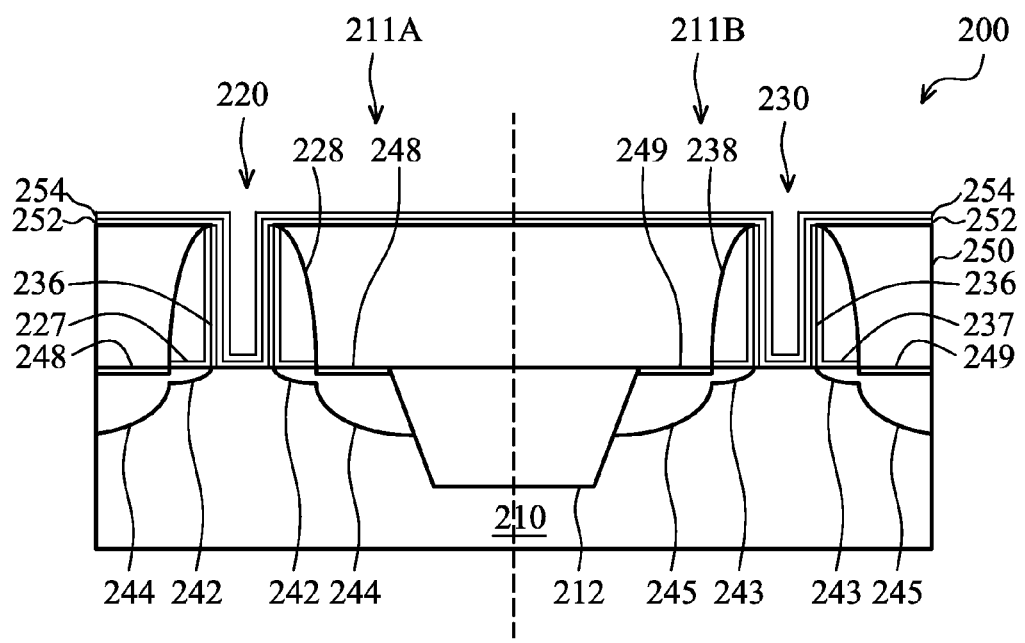

At block 106, as illustrated in FIGS. 2C and 2D, a high-k dielectric layer 252 and a capping layer 254 are formed over the substrate 210 and/or over the openings of the gate structures 220, 230. Particularly, the high-k dielectric layer 252 and capping layer 254 partially fill the openings of the gate structures 220, 230 in the first and second regions 211A, 211B. An interfacial layer may be formed between the semiconductor substrate 210 and the high-k dielectric material layer 252. For example, an interfacial layer including a thin silicon oxide layer can be formed on the substrate 210 before forming the high-k dielectric material layer 252 to a thickness ranging from about 5 Å to about 10 Å. The thin silicon oxide layer is formed by an ALD or thermal oxidation process. It is understood that the interfacial layer may be similar to interfacial layer 222, 232 described above.

The high-k dielectric layer 252 is formed by any suitable process to any suitable thickness. For example, the high-k dielectric layer 252 is formed by an ALD process to a thickness ranging from about 10 Å to about 30 Å. The high-k dielectric layer 252 comprises a high-k dielectric material, such as $HfO_2$, HfSiO, HfSiON, HfTaO, HfTiO, HfZrO, other suitable high-k dielectric materials, and/or combinations thereof. As noted above, the method 100 provides for a single high-k dielectric layer formation process. This may improve or eliminate issues arising from the double high-k dielectric deposition processes utilized in conventional processing.

The capping layer 254 is formed by any suitable process to any suitable thickness. For example, the capping layer 254 is formed by an ALD or PVD process to a thickness ranging from about 20 Å to about 40 Å. The capping layer 254 comprises titanium, titanium nitride, tantalum, tantalum nitride, other suitable materials, and/or combinations thereof. In the present example, the capping layer 254 comprises titanium nitride (TiN).

Figure 2E:
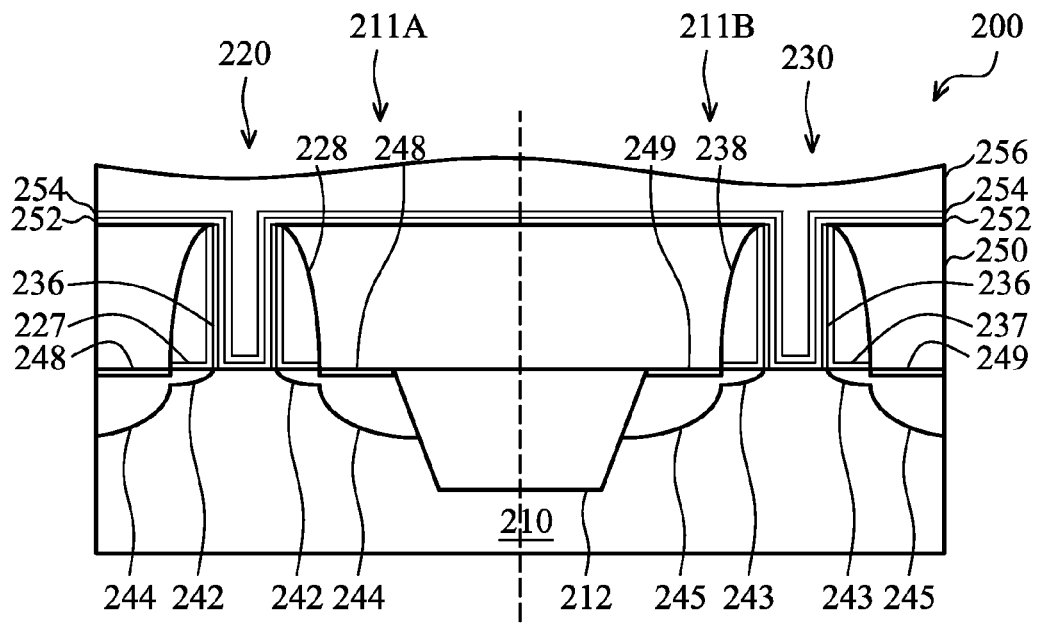
Figure 2F:
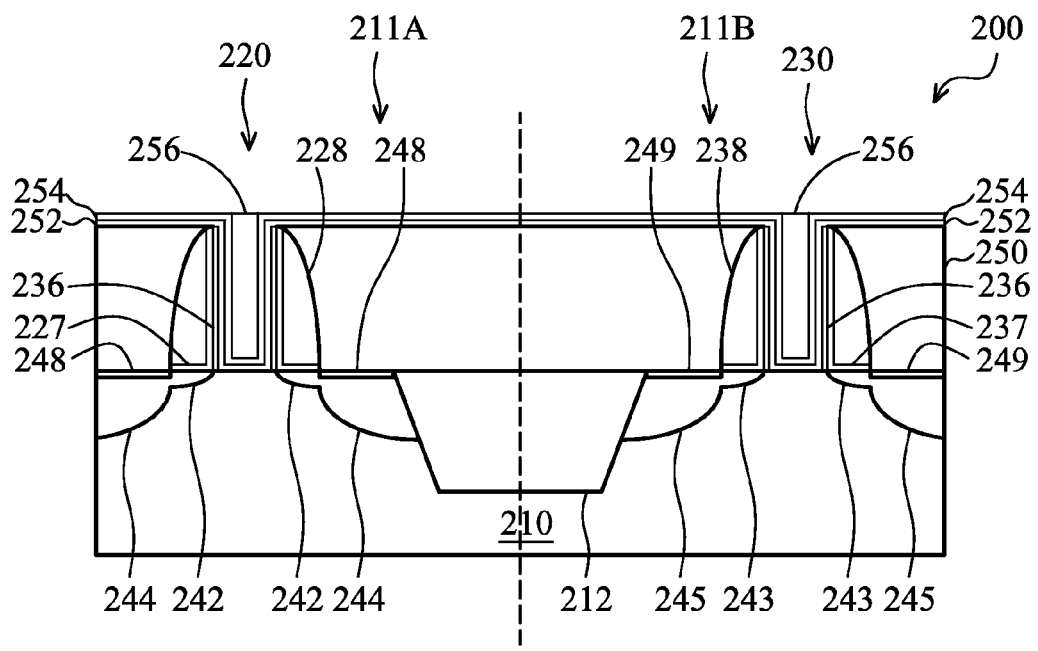

At block 108, referring to FIGS. 2E and 2F, a second dummy gate layer is formed over the substrate by any suitable process to any suitable thickness. For example, second dummy gate layer 256 is formed over the substrate 210 (and capping layer 254) to fill the remainder of the openings (trenches) in the gate structures 220, 230. In the present example, the second dummy gate layer 256 comprises polysilicon deposited by a CVD or PVD process. The second dummy gate layer 256 is deposited at a lower temperature than the first dummy gate layer 224, 234. The second dummy gate layer 256 may comprise multiple material layers. The second dummy gate layer 256 may be similar to the first dummy gate layer 224, 234. Subsequent to the deposition of the second dummy gate layer 256, one or more chemical mechanical polishing (CMP) processes may be performed, for example, until the capping layer 254 is reached as illustrated in FIG. 2F. It is understood that the second dummy gate layer 256 may comprise other suitable materials.

Referring to FIGS. 2G-2O, at blocks 110, 112, 114, 116, 118, and 120, a gate replacement process is performed. More particularly, a metal gate may replace the dummy poly gate of gate structures 220, 230 (i.e., a gate layer replaces the dummy gate layer 256). The metal gate may comprise one or more layers and/or materials. A patterned layer may be formed by conventional photolithography and patterning processes to overlay (or protect) a region of the substrate, wherein a gate of a first work function is formed in the gate structures of one region (e.g., first region 211A) while protecting another region (e.g., second region 211B), and vice versa. With reference to FIGS. 2G-2K, and at blocks 110, 112, 114, a gate structure having a first work function is formed. With reference to FIGS. 2L-2O, and at blocks 116, 118, 120, a gate structure having a second work function is formed.

Figure 2G:
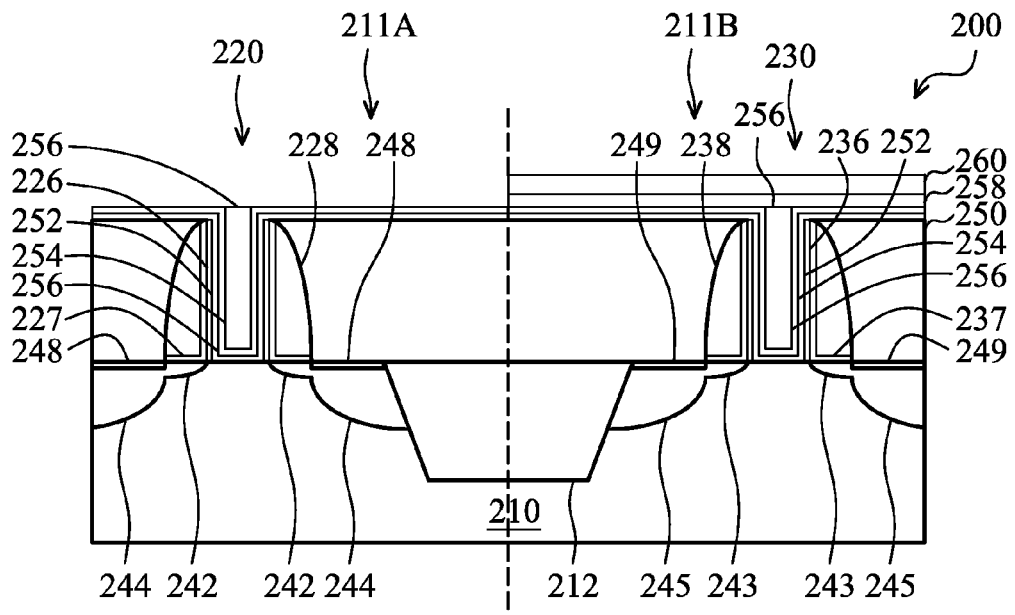
Figure 2H:
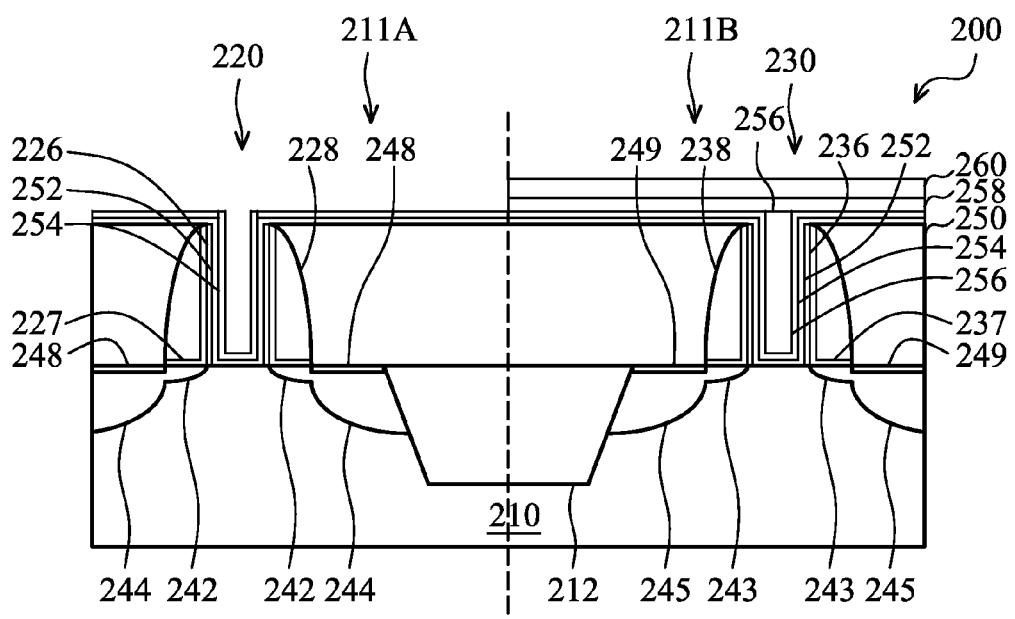

At block 110, the second dummy gate layer is removed from the gate structure in the first region, thereby forming a first opening (trench). Referring to FIGS. 2G and 2H, the second dummy gate layer 256 is removed from the gate structure 220 in the first/PMOS region 211A to form a first opening (trench). For example, a patterned layer (including a hard mask layer 258 and a photoresist layer 260) is formed over the gate structure 230 of the second/NMOS region 211B to protect the gate structure 230 from subsequent processing. The patterned layer is formed by conventional photolithography and patterning processes, such as those processes described herein. The hard mask layer 258 includes any suitable material, such as silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, or other suitable material. The hard mask layer 258 includes any suitable thickness. In an example, the hard mask layer 258 includes a PE-oxide or titanium nitride (TiN) layer having a thickness ranging from about 40 Å to about 100 Å. The photoresist layer 260 comprises any suitable material and includes a positive-type or negative-type resist material. An exemplary photoresist layer 260 includes a chemical amplifying (CA) resist layer.

The second dummy gate layer 256 is then removed from the gate structure 220 in the first/PMOS region 211A by any suitable process to form the first opening (trench). The first opening (trench) may be formed by one or more dry etching processes, wet etching processes, and/or combinations thereof. The etching process may include multiple etching steps to etch various material layers. For example, the dry etching process may use a fluorine-containing plasma (e.g., etch gas includes $CF_4$). In another example, the second dummy gate layer 256 is selectively etched away. Subsequently, the patterned layer may be removed by a stripping or ashing process or etching process. It is understood that the patterned hard mask layer 258 and photoresist layer 260 may be removed simultaneously or independently from the second dummy gate layer 256, using the same of different processes.

Figure 2I:
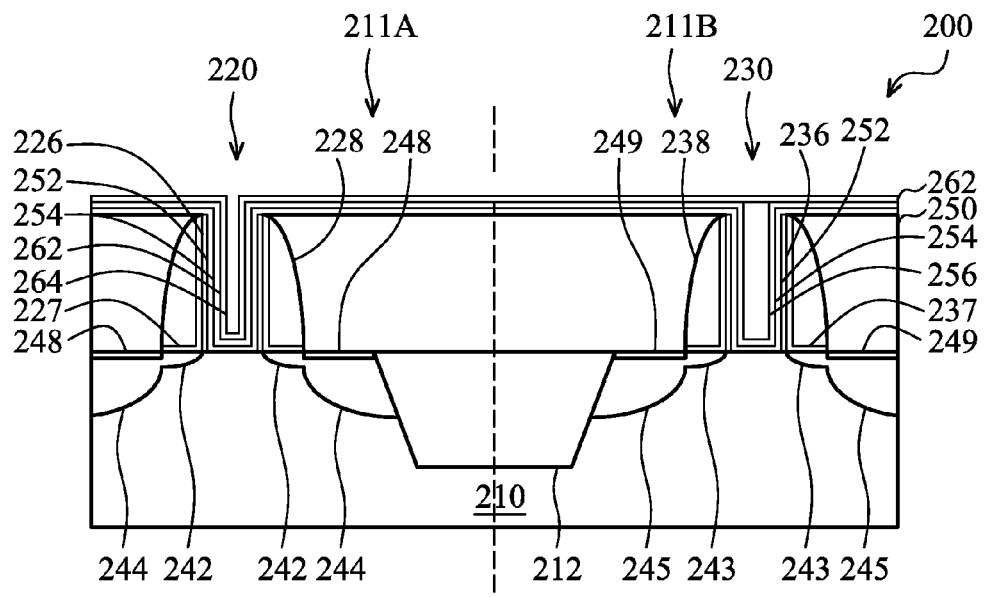

At blocks 112 and 114, a metal gate is formed in the first region. The metal gate may comprise a work function material and an additional conductive layer. Referring to FIG. 2I, at block 112, a first gate layer 262 is formed over the substrate 210 to partially fill in the first opening (trench) by any suitable process to any suitable thickness. The first gate layer 262 may comprise a work function layer. The work function layer includes any suitable material, such as aluminum, copper, tungsten, titanium, tantulum, titanium nitride, tantalum nitride, nickel silicide, cobalt silicide, silver, TaC, TaSiN, TaCN, TiAl, TiAlN, WN, metal alloys, other suitable materials, and/or combinations thereof. Exemplary work function layers for an NMOS device include tantalum nitride, titanium aluminum, titanium aluminum nitride, or combinations thereof; and exemplary work function layers for a PMOS device may include tungsten, titanium nitride, tungsten nitride, or combinations thereof. In the present example, the first gate layer 262 includes a p-type work function material (e.g., TiN, W, or WN) formed by an ALD or PVD process to a thickness ranging from about 20 Å to about 150 Å.

Figure 2J:
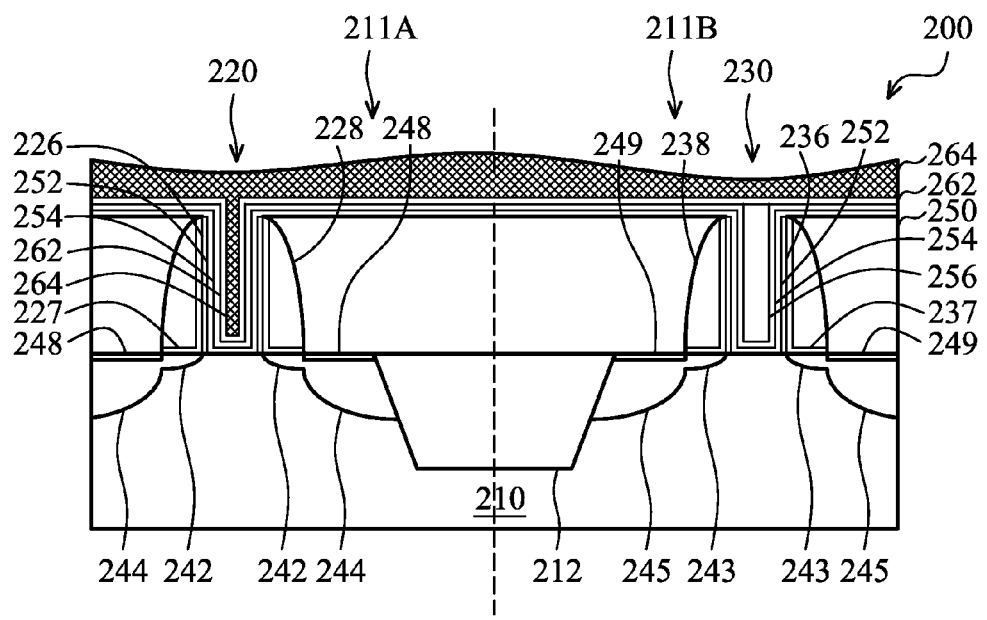
Figure 2K:
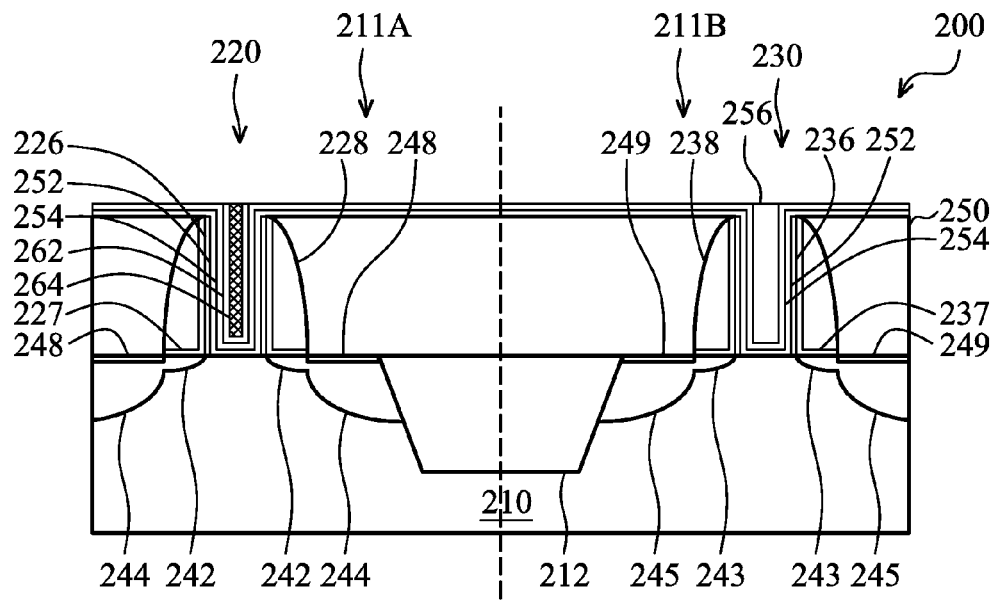

At block 114, a first conductive layer 264 is then formed over the first gate layer 262 to substantially fill in the remainder of the first opening as illustrated in FIG. 2J. The first conductive layer 264 includes any suitable material, such as aluminum, copper, tungsten, titanium, tantulum, titanium nitride, tantalum nitride, nickel silicide, cobalt silicide, silver, TaC, TaSiN, TaCN, TiAl, TiAlN, WN, metal alloys, other suitable materials, and/or combinations thereof. In the present example, the first conductive layer 264 comprises aluminum. The first conductive layer 264 is formed by any suitable process to any suitable thickness, such as an ALD or a PVD process. Subsequently, one or more CMP processes may be performed to planarize the first conductive layer 264. As illustrated in FIG. 2K, the CMP process may be performed until the capping layer 254 is reached, forming a metal gate having a first work function in the gate structure 220.

Figure 2L:
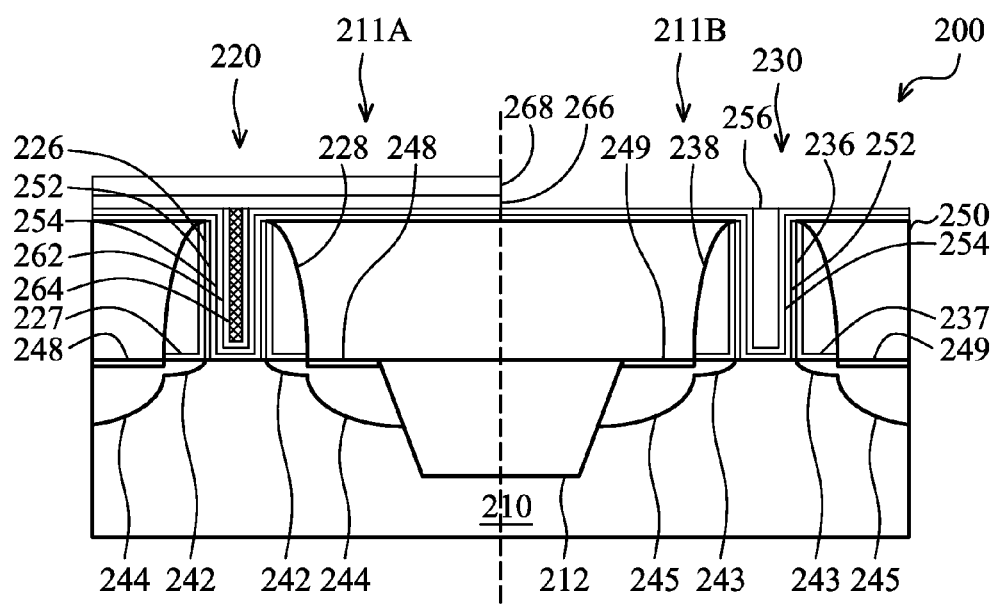
Figure 2M:
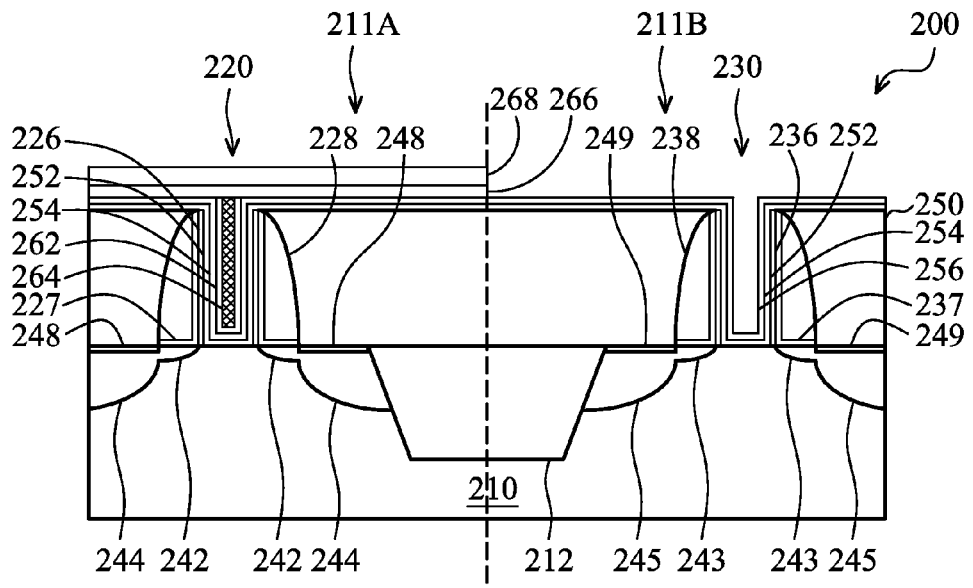
Figure 2N:
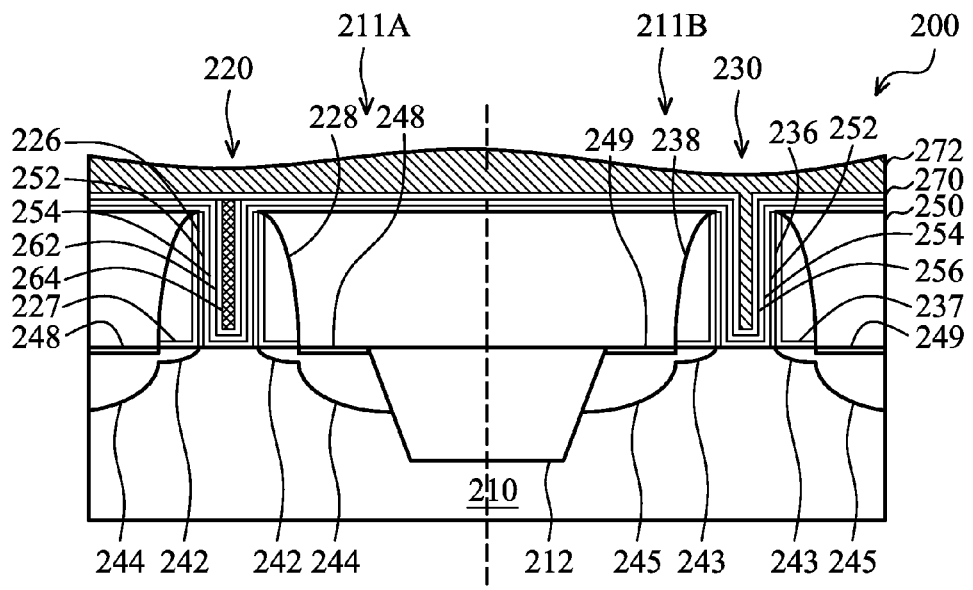

At block 116, the second dummy gate layer is removed from the gate structure in the second region, thereby forming a second opening (trench). Referring to FIGS. 2L and 2M, the second dummy gate layer 256 is removed from the gate structure 230 in the second/NMOS region 211B to form a second opening (trench). For example, a patterned layer (including a hard mask layer 266 and a photoresist layer 268) is formed over the gate structure 220 of the first/PMOS region 211A to protect the gate structure 220 from subsequent processing. The patterned layer is formed by conventional photolithography and patterning processes, such as those processes described herein. The hard mask layer 266 includes any suitable material, such as silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, or other suitable material. The hard mask layer 266 includes any suitable thickness. In an example, the hard mask layer 266 includes a PE-oxide or titanium nitride (TiN) layer having a thickness ranging from about 40 Å to about 100 Å. The photoresist layer 268 comprises any suitable material and includes a positive-type or negative-type resist material. An exemplary photoresist layer 268 includes a chemical amplifying (CA) resist layer.

The second dummy gate layer 256 is then removed from the gate structure 230 in the second/NMOS region 211B by any suitable process to form the second opening (trench). The second opening (trench) may be formed by one or more dry etching processes, wet etching processes, and/or combinations thereof. The etching process may include multiple etching steps to etch various material layers. For example, the dry etching process may use a fluorine-containing plasma (e.g., etch gas includes $CF_4$). In another example, the second dummy gate layer 256 is selectively etched away. Subsequently, the patterned layer may be removed by a stripping or ashing process or etching process. It is understood that the patterned hard mask layer 266 and photoresist layer 268 may be removed simultaneously or independently from the second dummy gate layer 256, using the same of different processes.

Referring to FIG. 2N, at blocks 118 and 120, a metal gate is formed in the second region. The metal gate may comprise a work function material and a conductive layer. At block 118, a second gate layer 270 is formed over the substrate 210 to partially fill in the second opening (trench) by any suitable process to any suitable thickness. The second gate layer 270 may comprise a work function layer. The work function layer includes any suitable material, such as aluminum, copper, tungsten, titanium, tantulum, titanium nitride, tantalum nitride, nickel silicide, cobalt silicide, silver, TaC, TaSiN, TaCN, TiAl, TiAlN, WN, metal alloys, other suitable materials, and/or combinations thereof. Exemplary work function layers for an NMOS device include tantalum nitride, titanium aluminum, titanium aluminum nitride, or combinations thereof; and exemplary work function layers for a PMOS device may include tungsten, titanium nitride, tungsten nitride, or combinations thereof. In the present example, the second gate layer 270 includes a n-type work function material (e.g., TiAl or TiAlN) formed by an ALD or PVD process to a thickness ranging from about 20 Å to about 150 Å.

At block 120, a second conductive layer 272 is then formed over the second gate layer 270 to substantially fill in the remainder of the second opening as illustrated in FIG. 2N. The second conductive layer 272 includes any suitable material, such as aluminum, copper, tungsten, titanium, tantulum, titanium nitride, tantalum nitride, nickel silicide, cobalt silicide, silver, TaC, TaSiN, TaCN, TiAl, TiAlN, WN, metal alloys, other suitable materials, and/or combinations thereof. In the present example, the second conductive layer 272 comprises aluminum. The second conductive layer 272 is formed by any suitable process to any suitable thickness, such as an ALD or a PVD process. Subsequently, one or more CMP processes may be performed to planarize the second conductive layer 272. The CMP process may further planarize the semiconductor device 200.

It is understood that the n-metal and p-metal structures may be formed in any order. Further, during the formation of the metal gate structures for the first/PMOS device region 211A and the second/NMOS device region 211B, N/P patterning may be implemented to separate one type of device from the other, and vice versa. The metal gates may further comprise liner layers, work function layers, fill layers, other suitable layers, and/or combinations thereof. It is also understood that the semiconductor device 200 may undergo further CMOS or MOS technology processing to form various features known in the art. Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

In summary, a gate replacement process is provided. The gate replacement process described implements a double dummy gate deposition process, which addresses issues found in conventional processing (e.g., preventing gap fill issues as gate lengths become smaller and providing a single high-k dielectric layer deposition process). A first dummy gate and a second dummy gate may be provided to fabricate the semiconductor device 200. In an example, the method comprises removing a first dummy gate to form a first trench; forming a high-k dielectric layer, a capping layer, and/or a second dummy gate within the first trench; removing the second dummy gate to form a second trench in a first region; forming a first gate within the second trench; removing the second dummy gate to form a third trench in a second region; and forming a second gate within the third trench. The resulting semiconductor device may comprise a plurality of NMOS and PMOS devices.

Low Thermal Budget Silicon Capping Layer Method

Figure 3:
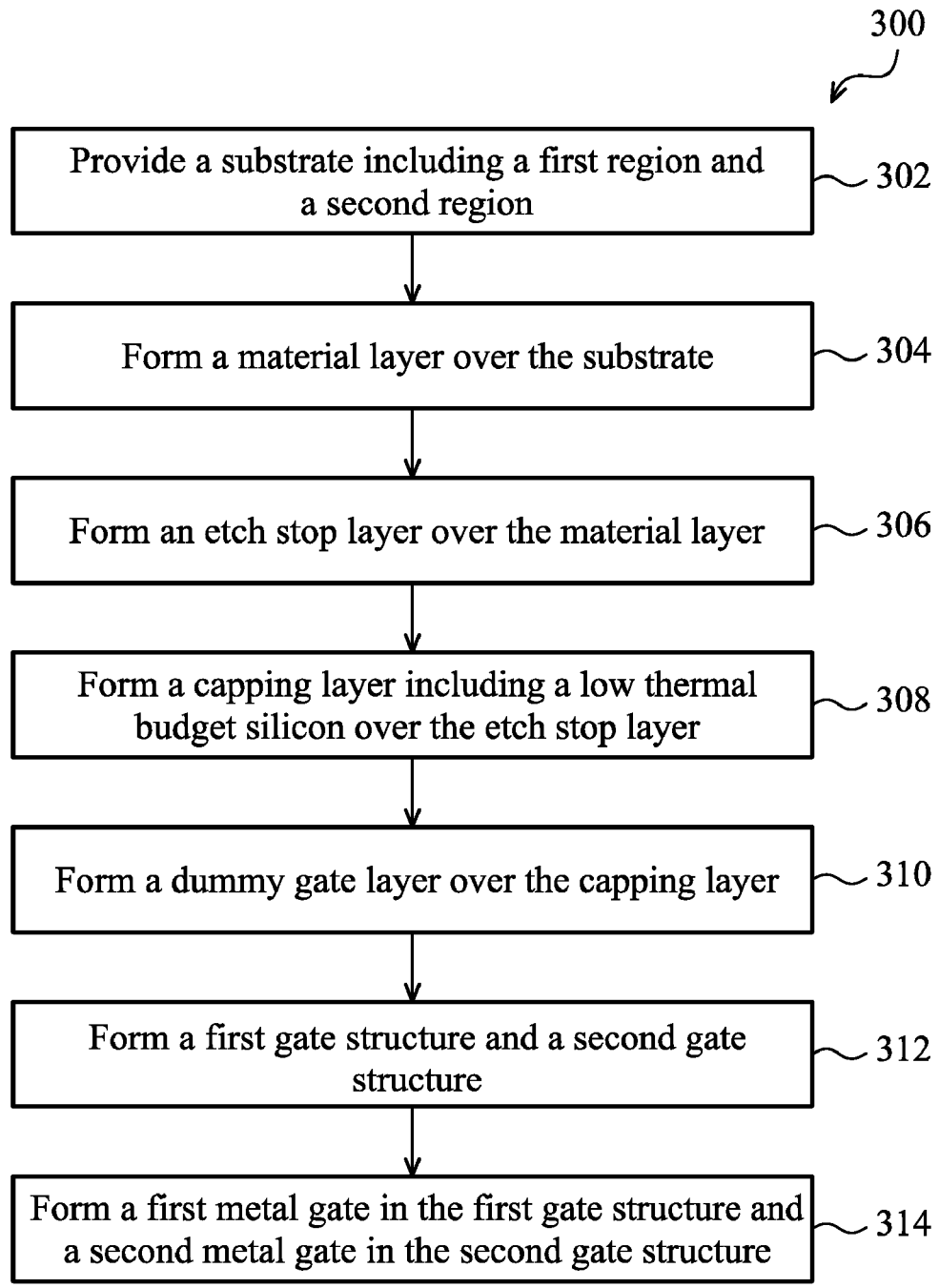
FIG. 3 is a flow chart of a method for fabricating an integrated circuit device according to aspects of the present disclosure.

FIG. 3 is a flow chart of one embodiment of the method 300 for fabricating the semiconductor device 400 in a "gate last" process. FIGS. 4A-4G are various cross-sectional views of the semiconductor device 400 according to one embodiment, in portion or entirety, during various fabrication stages of the method 300. Conventional gate replacement processes strive to reduce an equivalent oxide thickness (EOT) exhibited by an integrated circuit device. In these integrated circuit device, a thickness of an interfacial layer is a substantial portion of the EOT exhibited by the final fabricated device, particularly in high-k/metal gate devices. Thus, reducing the thickness of the interfacial layer can improve EOT scaling.

The initial thickness of the interfacial layer may be easily reduced by a pre-clean process, such as a diluted HF (DHF) dipping process. However, it has been observed that the final thickness of the interfacial layer depends on a thermal budget, not necessarily the initial thickness. For example, re-growth of the interfacial layer results from oxygen transporting from the substrate during high thermal budget processes (e.g., a source/drain annealing process). This detrimentally affects the EOT of the final device. The method 400 introduces an etch stop layer and a low thermal budget silicon capping layer over the over the high-k dielectric layer/interfacial layer. The etch stop layer can minimize the oxygen content absorbed by the interfacial layer from the substrate during subsequent high thermal budget processes. The etch stop layer essentially absorbs oxygen from the interfacial layer to facilitate EOT reduction. The low thermal budget silicon capping layer can help control oxygen content in the etch stop layer. Implementing the etch stop layer and low thermal budget silicon capping layer barely impacts current replacement gate process flows and can provide significant EOT reduction. It is understood that different embodiments may have different advantages, and that no particular advantage is necessarily required of any embodiment.

Figure 4A:
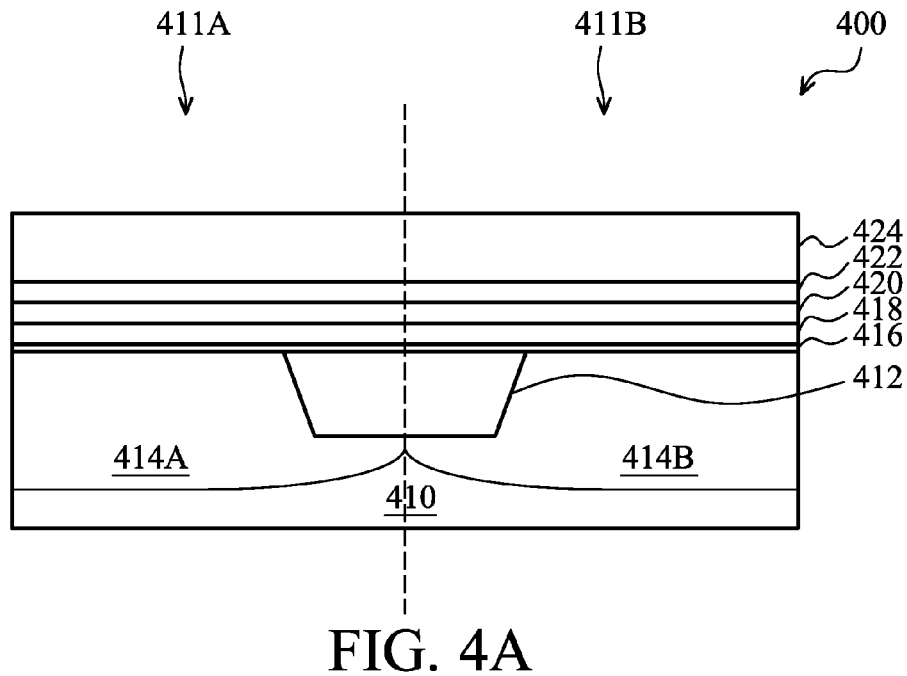
FIGS. 4A-4G are various cross-sectional views of embodiments of an integrated circuit device during various fabrication stages according to the method of FIG. 3.

Referring to FIGS. 1 and 4A, the method 300 begins at block 302 wherein a substrate 410 including a first region 411A and a second region 411B is provided. In the present embodiment, the substrate 410 is a semiconductor substrate comprising silicon. Alternatively, the substrate 410 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

One exemplary isolation region 412 is formed on the substrate 410 to isolate various regions (e.g., first and second regions 411A, 411B) of the substrate 410, and in the present embodiment, to isolate the NMOS and PMOS device regions. The isolation region 412 utilizes isolation technology, such as local oxidation of silicon (LOCOS) or shallow trench isolation (STI), to define and electrically isolate the various first and second regions 411A, 411B. In the present embodiment, the isolation region 412 includes a STI. The isolation region 412 comprises silicon oxide, silicon nitride, silicon oxynitride, other suitable materials, or combinations thereof. The isolation region 412 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric material. In some examples, the filled trench may have a multi-layer structure such as a thermal oxide liner layer filled with silicon nitride or silicon oxide.

The substrate 410 may include various doped regions depending on design requirements as known in the art (e.g., p-type wells or n-type wells). The doped regions may be doped with p-type dopants, such as boron or $BF_2$, and/or n-type dopants, such as phosphorus or arsenic. The doped regions may be formed directly on the substrate 410, in a P-well structure, in a N-well structure, in a dual-well structure, or using a raised structure. The semiconductor substrate 410 may further include various active regions, such as regions configured for an N-type metal-oxide-semiconductor transistor device (referred to as an NMOS) and regions configured for a P-type metal-oxide-semiconductor transistor device (referred to as a PMOS). In the present embodiment, the substrate 410 includes first region 411A configured for a NMOS device and second region 411B configured for a PMOS device. More particularly, the first region 411A includes an p-well region 414A, and the second region 411B includes a n-well region 414B. It is understood that the semiconductor device 400 may be formed by CMOS technology processing, and thus some processes are not described in detail herein.

At block 304, a material layer is formed over the substrate 410. The material layer includes one or more material layers comprising any suitable material and thickness. For example, the material layer includes an interfacial layer 416 and a high-k dielectric layer 418. The material layer is formed by any suitable process including chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

The interfacial layer 416 and high-k dielectric layer 418 are formed over the substrate 410 by any suitable process to any suitable thickness. For example, the interfacial layer 416 may include a grown silicon oxide layer (e.g., thermal oxide or chemical oxide). Alternatively, the interfacial layer 416 may comprise silicon oxynitride (SiON). In an example, before the interfacial layer 416 is grown over the substrate 410, a last pre-gate clean (e.g., utilizing an HF solution) and UV process may be performed. The high-k dielectric layer 418 comprises a high-k dielectric material, such as $HfO_2$, HfSiO, HfSiON, HfTaO, HfTiO, HfZrO, other suitable high-k dielectric materials, and/or combinations thereof.

At block 306, an etch stop layer 420 is formed over the substrate 410. The etch stop layer 420 is also formed over the interfacial and high-k dielectric layers 416, 418. The etch stop layer 420 comprises titanium, titanium nitride, tantalum, tantalum nitride, other suitable material, and/or combinations thereof. In the present example, the etch stop layer 420 comprises titanium nitride (TiN). As noted above, the etch stop layer 420 minimizes the oxygen content absorbed by the interfacial layer 416 from the substrate during subsequent high thermal budget processes. The etch stop layer 420 absorbs oxygen from the interfacial layer 416 to facilitate EOT reduction.

As further noted above, it is advantageous to control the oxygen content of the etch stop layer 420. Thus, in the present embodiment, at block 308, a capping layer 422 is formed over the substrate 410. The capping layer 422 is also formed over the etch stop layer 420 and material layer including interfacial and high-k dielectric layers 416, 418. The capping layer 422 comprises a low thermal budget silicon layer, such as a silicon layer deposited by a physical vapor deposition (PVD) process. The capping layer 422 including the low thermal budget silicon controls the oxygen content in the etch stop layer 420, which further prevents the interfacial layer 416 from growing during subsequent processing, and further reduces the equivalent oxide thickness.

At block 310, a dummy gate layer 424 is formed over the substrate 410. The dummy gate layer 424 is further formed over the capping layer 422, etch stop layer 418, and material layer including interfacial and high-k dielectric layers 416, 418. The dummy gate layer 424 is formed by any suitable process to any suitable thickness. The dummy gate layer 424 comprises any suitable material. In the present example, the dummy gate layer 424 comprises a silicon layer formed by a low pressure CVD process. The dummy gate layer 424 may comprise multiple material layers.

Figure 4B:
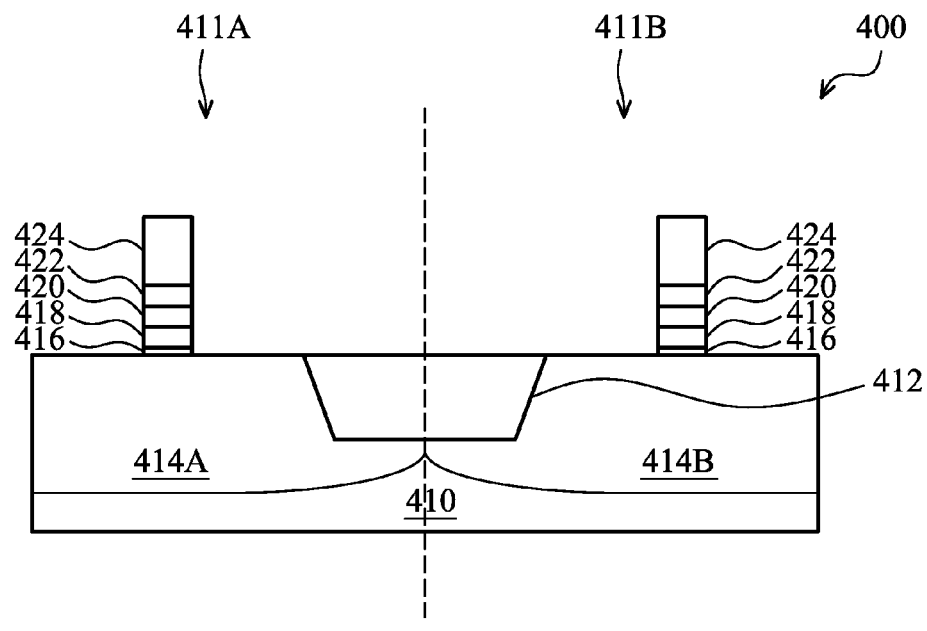
Figure 4C:
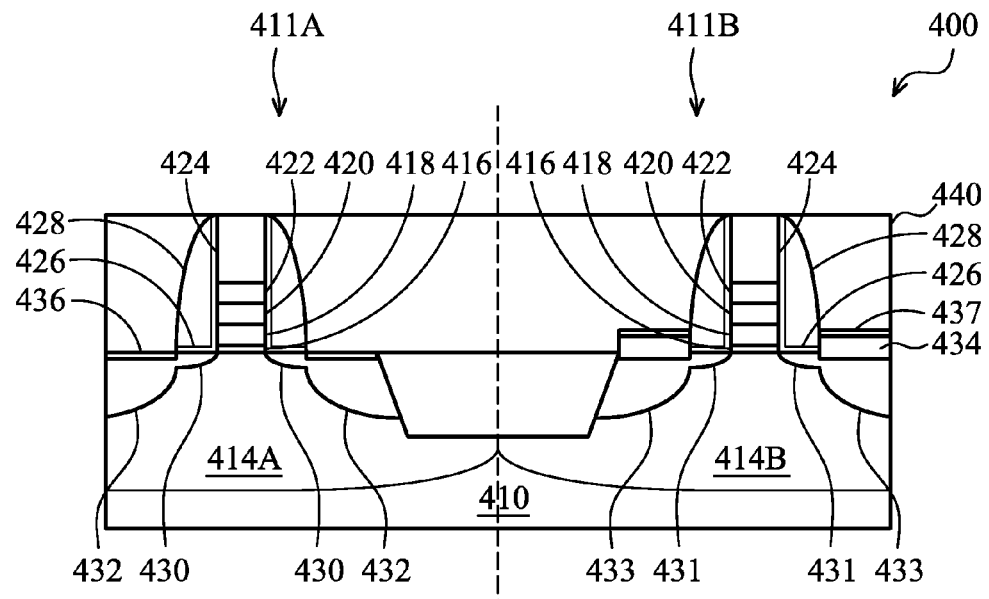

Referring to FIGS. 3 and 4B-4C, at block 312, a first gate structure and a second gate structure are formed over the substrate 410—at least one gate structure is formed over the substrate in the first region 411A and at least one gate structure is formed over the substrate in the second region 411B. In the present embodiment, a first gate structure is formed within the first/NMOS region 411A, and a second gate structure is formed within the second/PMOS region 411B. The gate structures are formed by any suitable process. For example, the gate structures are formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, and ion-beam writing. The etching processes include dry etching, wet etching, and/or other etching methods (e.g., reactive ion etching). The etching process can also be either purely chemical (wet etching), purely physical (ion milling), and/or combinations thereof. It is understood that the gate structures may be formed simultaneously, utilizing the same processing steps and processing materials; independently of one another, utilizing varying processing steps and processing materials; or using a combination of simultaneous and independent processing steps and processing materials.

In the present embodiment, gate stacks comprising the interfacial layer 416, high-k dielectric layer 418, etch stop layer 420, capping layer 422, and dummy gate layer 424 are formed by any suitable process, including the processes described herein. For example, a layer of photoresist is formed over the dummy gate layer by a suitable process, such as spin-on coating, and patterned to form a patterned photoresist feature. The pattern of the photoresist can then be transferred by a dry etching process to the underlying layers (i.e., the interfacial layer 416, high-k dielectric layer 418, etch stop layer 420, capping layer 422, and dummy gate layer 424) to form the gate stacks as shown in FIG. 4B. The photoresist layer may be stripped thereafter. In another example, a hard mask layer is formed over the dummy gate layer; a patterned photoresist layer is formed on the hard mask layer; the pattern of the photoresist layer is transferred to the hard mask layer and then transferred to the dummy gate layer 424 and underlying layers (interfacial layer 416, high-k dielectric layer 418, etch stop layer 420, and capping layer 422) to form the gate stack of the gate structures. It is understood that the above examples do not limit the processing steps that may be utilized to form the gate stack. It is further understood that the gate stack of the gate structures may comprise additional layers. For example, the gate structures may comprise interfacial layers, capping layers, diffusion/barrier layers, conductive layers, other suitable layers, and/or combinations thereof. Also, the semiconductor device 400 may include one or more antireflective coating layers (e.g., a top antireflective coating layer and/or a bottom antireflective coating layer).

Additional features are subsequently formed for the gate structures as illustrated in FIG. 4C. For example, spacers may further be formed on the sidewalls of the gate stacks. In the present embodiment, spacer liner 426 and gate spacers 428 are formed. The spacer liner 426 and gate spacers 428 are formed by any suitable process to any suitable thickness. The spacer liner 426 may comprise an oxide material (e.g., silicon oxide), and the gate spacers 428, which are positioned on each side of the gate stacks, may comprise a nitride material (e.g., silicon nitride). In various examples, the gate spacers 428 may comprise a dielectric material such as silicon nitride, silicon carbide, silicon oxynitride, other suitable materials, and/or combinations thereof. The gate spacers 428 may be used to offset subsequently formed doped regions, such as heavily doped source/drain regions. The gate structures may further include a sealing layer and any other suitable feature.

Various doped regions may also be formed in the substrate 410. In the present embodiment, various doped regions comprise lightly doped source/drain (LDD) regions 430, 431 and source/drain (S/D) regions 432, 433 (also referred to as heavily doped S/D regions). The LDD regions 430, 431 and S/D regions 432, 433 may be formed by one or more ion implantation processes, photolithography, diffusion, and/or other suitable processes. The doping species may depend on the type of device being fabricated, such as an NMOS or PMOS device. For example, the LDD and S/D regions 430, 432 in the first/NMOS region 411A are doped with n-type dopants, such as phosphorus or arsenic; and the LDD and S/D regions 431, 433 in the second/PMOS region 411B are doped with p-type dopants, such as boron or $BF_2$. The LDD regions 430, 431 and S/D regions 432, 433 may comprise various doping profiles. It is understood that the LDD regions may be formed prior to formation of the gate spacers 428. Additionally, one or more annealing processes may be performed to activate the LDD regions 430, 431 and/or S/D regions 432, 433. The annealing processes comprise rapid thermal annealing (RTA) and/or laser annealing processes. The S/D regions 432, 433 may be aligned with an outer edge of the spacers 428 following the one or more implantation processes.

The doped regions may be formed directly in the semiconductor substrate, in a P-well structure, in a N-well structure, in a dual-well structure, or using a raised structure. The S/D regions 432, 433 may comprise raised S/D regions, which are formed by one or more epitaxy processes, such that SiGe features can be formed in a crystalline state in the substrate 410. For example, in the present embodiment, in the second region 411B, the S/D regions 433 further include raised S/D regions 434. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 410 (e.g., silicon). Thus, a strained channel may be achieved in the first or second regions 411A, 411B, depending on device configuration, to increase carrier mobility and enhance device performance.

As noted above, the final thickness of the interfacial layer 416 depends on subsequent thermal budget processes. Typically, the high thermal budget processes, such as the S/D annealing processes, cause re-growth of the interfacial layer 416, which leads to a thicker interfacial layer 416 and increased EOT. In the present embodiment, during these processes (and the subsequent gate replacement processes that will be discussed further below), the low thermal budget silicon capping layer 422 controls the oxygen content in the etch stop layer 420, and the etch stop layer 420 absorbs oxygen from the interfacial layer 416, which ultimately results in reducing the thickness of the interfacial layer 416 and providing EOT scaling.

One or more contact features 436, 437, such as silicide regions, may also be formed. The contact features 436, 437 may be coupled to the S/D regions 432, 433. The contact features 436, 437 comprise silicide materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features 436, 437 are formed by any suitable process, including the processes described herein. For example, the contact features 436, 437 may be formed by a salicide (self-aligned silicide) process. A metal material may be deposited over the substrate, including over the substrate (e.g., silicon regions) and/or doped regions. After deposition, the salicidation process may continue with a reaction between the deposited metal material and the silicon regions at an elevated temperature that is selected based on the specific metal material or materials. This is also referred to as annealing, which may be a RTP. The unreacted metal material is removed thereafter. The reacted silicide may require additional thermal process to reduce the resistance of the silicide.

A dielectric layer 440 is disposed over the substrate 410, such as an interlayer (or inter-level) dielectric (ILD) layer. The dielectric layer 440 comprises any suitable dielectric material including TEOS oxide, silicon oxide, silicon nitride, silicon oxynitride, hafnium oxide, zirconium oxide, titanium oxide, aluminum oxide, hafnium dioxide-alumina ($HfO_2$—$Al_2O_3$) alloy, PSG, BPSG, other suitable dielectric materials, and/or combinations thereof. Alternatively, the dielectric layer 440 comprises a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Michigan), polyimide, other proper materials, and/or combinations thereof. The dielectric layer 440 may further include a multilayer structure comprising multiple dielectric materials. The dielectric layer 440 is formed by any suitable process to any suitable thickness, including by CVD, high density plasma CVD, spin-on, sputtering, and/or other suitable methods. After the dielectric layer 440 is deposited, one or more chemical mechanical polishing (CMP) processes can be performed. It is understood that additional layers may be formed overlying and/or underlying the dielectric layer 440.

Figure 4D:
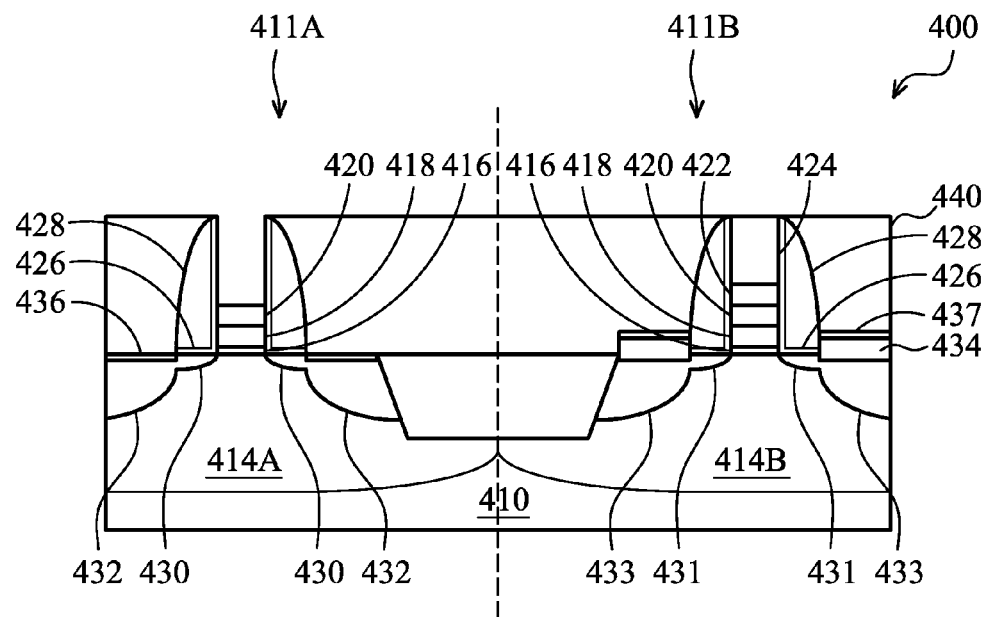
Figure 4E:
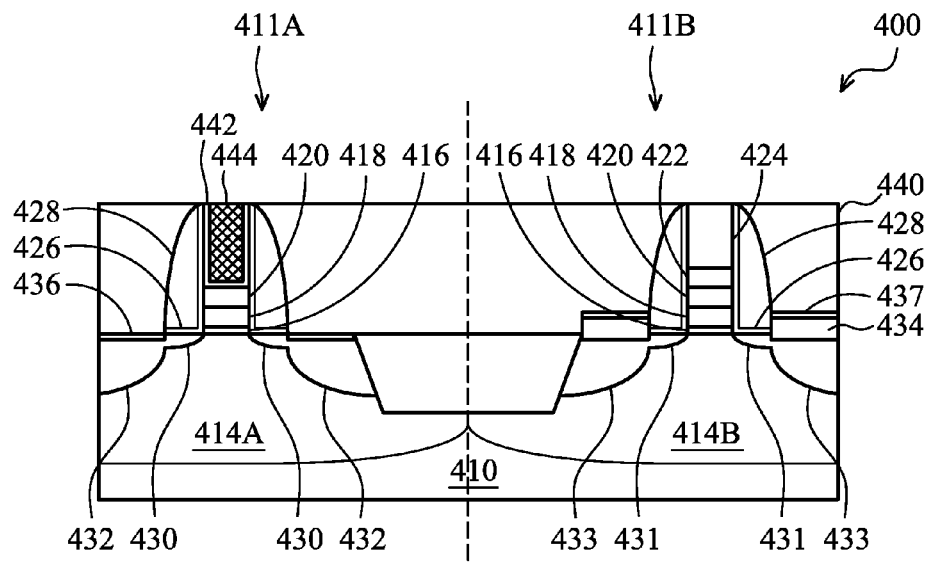
Figure 4F:
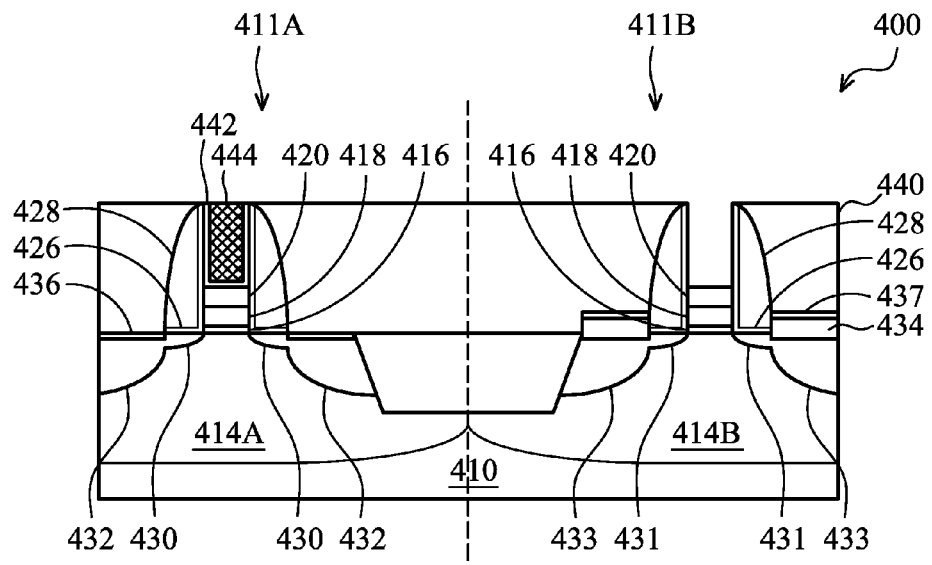

Referring to FIGS. 4D-4G, at block 314, a gate replacement process is performed. More particularly, a metal gate may replace the dummy poly gate of the gate structures (i.e., a gate layer replaces the dummy gate layer 424). A first metal gate is formed in the first gate structure, and a second gate structure is formed in the second gate structure. The first and second metal gates are formed by any suitable process. For example, as illustrated in FIGS. 4D and 4F, portions of the first gate structure and the second gate structure are removed, thereby forming openings (trenches) in the gate structures. For example, the dummy gate layer 424 and capping layer 422 are removed from the gate structures by any suitable process. In an example, removing dummy gate layer 424 and capping layer 422 includes one or more etching processes, including wet etching processes, dry etching processes, or combinations thereof. Another example includes forming a photoresist layer over the semiconductor device 400; patterning the photoresist layer by a conventional photolithography process; and etching the dummy gate layer 424 and capping layer 422 within the pattern of the photoresist layer. Subsequently, the photoresist layer may be removed. It is understood that the dummy gate layer 424 may be removed simultaneously with or independent of the capping layer 422. It is further understood that additional portions of the gate structures can be removed, such as the etch stop layer 420 and/or high-k dielectric layer 418.

Figure 4G:
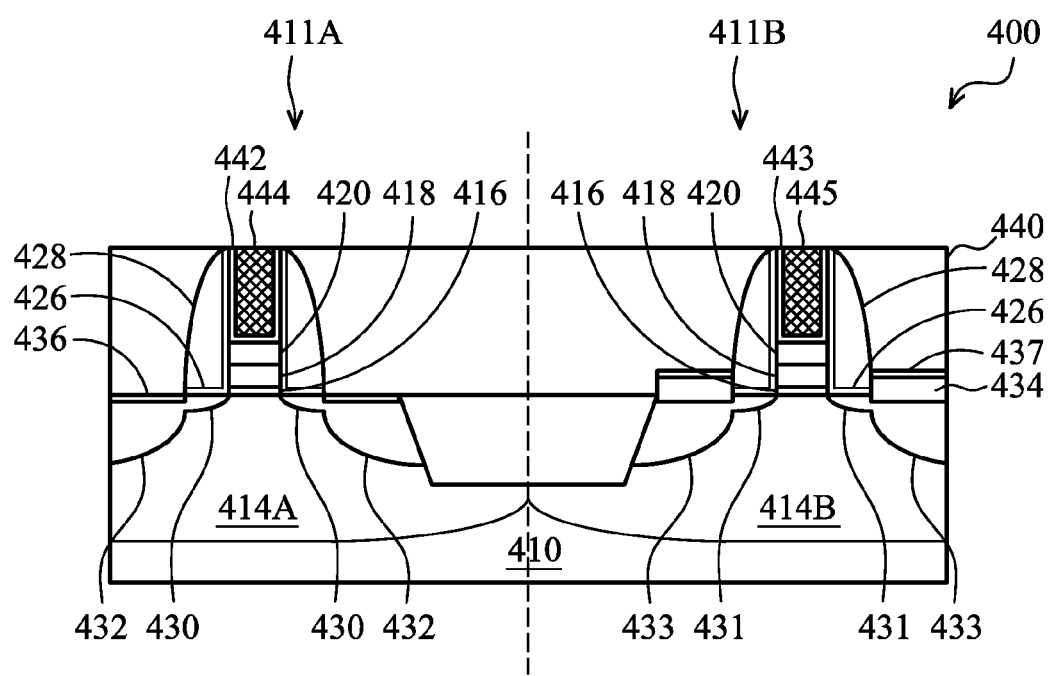

A first metal gate and second metal gate are formed in the openings (trenches), which were formed by removing portions of the gate structures, for example, the dummy gate layer 424 and the capping layer 422. Referring to FIGS. 4E and 4G, the first and second metal gates include first and second gate layers 442, 443 and conductive layers 444, 445.

The first gate layer 442 may have a first work function, and the second gate layer 443 may have a second work function. The first and second metal gates may further comprise liner layers, work function layers, fill layers, other suitable layers, and/or combinations thereof.

The first and second gate layers 442, 443 are formed by any suitable process. The first and second gate layers 442, 443 partially fill in the openings (trenches) of the gate structures. The first and second gate layers 442, 443 comprise a work function layer. Thus, in the first/NMOS region 411A, an exemplary first gate layer 442 includes a work function layer for an NMOS device, such as tantalum, titanium aluminum, titanium aluminum nitride, or combination thereof; and in the second/PMOS region 411B, an exemplary second gate layer 443 includes titanium nitride, tantalum nitride, or combinations thereof. Alternatively, the first and second gate layers 442, 443 include any suitable material, such as aluminum, copper, tungsten, titanium, tantalum, titanium nitride, tantalum nitride, nickel silicide, cobalt silicide, silver, TaC, TaSiN, TaCN, TiAl, TiAlN, WN, metal alloys, other suitable materials, and/or combinations thereof.

The first and second conductive layers 444, 445 are formed over the first and second gate layers 442, 443 by any suitable process. The first and second conductive layers 444, 445 substantially fill in the remainder of the openings (trenches) of the gate structures. The first and second layers 444, 445 include any suitable material, such as aluminum, copper, tungsten, titanium, tantalum, titanium nitride, tantalum nitride, nickel silicide, cobalt silicide, silver, TaC, TaSiN, TaCN, TiAl, TiAlN, WN, metal alloys, other suitable materials, and/or combinations thereof. In the present example, the first and second conductive layers 444, 445 comprise aluminum. The aluminum is deposited by an ALD or PVD process. Alternatively, the first conductive layer 444 comprises a material different than the second conductive layer 445. Subsequently, one or more CMP processes may be performed to planarize the first and second conductive layers 444, 445.

The semiconductor device 400 may undergo further CMOS or MOS technology processing to form various features known in the art. Subsequent processing may form various contacts/vias/lines and multilayer interconnect features (e.g., metal layers and interlayer dielectrics) on the substrate 410, configured to connect the various features or structures of the semiconductor device 400. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

In summary, a gate replacement process is provided. The gate replacement process described implements an etch stop layer and a capping layer including a low thermal budget silicon. The gate replacement process may be implemented to form an integrated circuit device having one or more gate structures. The disclosed method may be easily integrated into conventional integrated circuit processing, particularly in high-k/metal gate device fabrication, and can provide equivalent oxide thickness reduction. In an example, the method comprises forming a material layer over a substrate; forming an etch stop layer over the material layer; forming a capping layer including low thermal budget silicon over the etch stop layer; forming a dummy gate over the capping layer; forming a gate structure; and forming a first metal gate in the first gate structure. Forming the first metal gate in the first gate structure may include replacing the dummy gate with a metal gate having a work function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit device, the method comprising:
   providing a substrate;
   forming a gate structure including a first dummy gate over the substrate;
   removing the first dummy gate from the gate structure to form a trench;
   forming an interfacial layer, high-k dielectric layer, and capping layer to partially fill in the trench;
   forming a second dummy gate over the capping layer, wherein the second dummy gate fills the trench; and
   replacing the second dummy gate with a metal gate, wherein replacing the second dummy gate includes completely removing the second dummy gate from the trench.

2. The method of claim 1 wherein forming the second dummy gate comprises depositing the second dummy gate at a temperature lower than the first dummy gate.

3. The method of claim 1 wherein forming the gate structure including the first dummy gate comprises depositing a first polysilicon layer to form the first dummy gate.

4. The method of claim 3 wherein forming the second dummy gate comprises depositing a second polysilicon layer at a temperature lower than the first polysilicon layer.

5. The method of claim 4 further comprising performing a chemical mechanical polishing process after depositing the second polysilicon layer.

6. The method of claim 4 wherein depositing the second polysilicon layer comprises performing a physical vapor deposition (PVD) or chemical vapor deposition (CVD) process.

7. The method of claim 6 wherein replacing the second dummy gate of the first gate structure with the first gate and replacing the second dummy gate of the second gate structure with the second gate comprises:
   removing the second dummy gate from the first gate structure to form a first trench;
   forming a first gate layer to partially fill the first trench;
   forming a first conductive layer over the first gate layer to fill the first trench;
   removing the second dummy gate from the second gate structure to form a second trench;
   forming a second gate layer to partially fill the second trench; and
   forming a second conductive layer over the second gate layer to fill the second trench.

8. The method of claim 6 wherein replacing the second dummy gate of the first gate structure with the first gate and replacing the second dummy gate of the second gate structure with the second gate comprises forming the first gate having a first work function and the second gate having a second work function.

9. The method of claim 1 wherein forming the capping layer comprises:
   depositing an etch stop layer; and
   depositing a low thermal budget silicon layer over the etch stop layer.

10. The method of claim 1 wherein replacing the second dummy gate with a metal gate comprises:
    replacing the second dummy gate of a first gate structure in a first region with a first gate; and
    replacing the second dummy gate of a second gate structure in a second region with a second gate.

11. A method comprising:
    forming a gate structure including a first dummy gate over a substrate;
    removing the first dummy gate from the gate structure to form a trench;
    forming a second dummy gate in the trench;
    removing the entire second dummy gate from the trench; and
    forming a gate electrode within the trench.

12. The method of claim 11, further comprising forming an interfacial layer, high-k dielectric layer, and capping layer to partially fill in the trench.

13. The method of claim 12, wherein forming the second dummy gate in the trench occurs after forming the interfacial layer, high-k dielectric layer, and capping layer to partially fill in the trench.

14. The method of claim 11, wherein forming the gate electrode within the trench occurs after removing the entire second dummy gate from the trench.

15. The method of claim 11, wherein the gate electrode is a metal gate electrode.

16. The method of claim 11, wherein forming the gate electrode within the trench includes:
    forming a metal gate layer in the trench; and
    forming a conductive layer over the metal layer in the trench.

17. The method of claim 16, wherein the metal gate layer is formed of a first material and the conductive layer is formed of a second material that is different from the first material.

18. The method of claim 11, wherein the first and second dummy gates are formed of polysilicon.

19. A method comprising:
    forming a gate structure including a first dummy gate over a substrate, the gate structure disposed within an interlayer dielectric layer;
    removing the first dummy gate from the gate structure to form a trench;
    forming a high-k dielectric layer to partially fill in the trench and to cover a portion of the interlayer dielectric layer;
    forming a second dummy gate over the high-k dielectric layer within trench and covering the portion of the interlayer dielectric layer;
    removing the second dummy gate from the trench; and
    forming a gate electrode within the trench.

20. The method of claim 19, wherein removing the second dummy gate from the trench includes removing the entire second dummy gate from the trench.

* * * * *